United States Patent [19]

Okumura

[11] Patent Number: 5,631,478

[45] Date of Patent: May 20, 1997

[54] SEMICONDUCTOR INTEGRATED CIRCUITS WITH SPECIFIC PITCH MULTILEVEL INTERCONNECTIONS

[75] Inventor: Koichiro Okumura, Tokyo, Japan

[73] Assignee: NEC Corporation, Tokyo, Japan

[21] Appl. No.: 356,675

[22] Filed: Dec. 15, 1994

[30] Foreign Application Priority Data

Dec. 15, 1993 [JP] Japan ................... 5-342848

[51] Int. Cl.$^6$ ................................. H01L 27/10
[52] U.S. Cl. ................ 257/211; 257/758; 257/773
[58] Field of Search .......................... 257/211, 758, 257/775, 773

[56] References Cited

U.S. PATENT DOCUMENTS

| 5,060,045 | 10/1991 | Owada et al. | 257/211 |
| 5,119,170 | 6/1992 | Iwamatsu | 257/773 |

FOREIGN PATENT DOCUMENTS

| 408060 | 1/1991 | European Pat. Off. | 257/211 |
| 525824 | 2/1993 | European Pat. Off. | 257/758 |
| 60-343039 | 2/1985 | Japan . | |
| 63-132448 | 6/1988 | Japan . | |

OTHER PUBLICATIONS

Denboer, A.; "Inside Today's Leading Edge Microprocessors," Semiconductor International, Feb., 1994.

Primary Examiner—Jerome Jackson
Assistant Examiner—John Guay
Attorney, Agent, or Firm—Young & Thompson

[57] ABSTRACT

A multilevel interconnection structure for semiconductor integrated circuits has five or more multiple interconnection layers, each of which includes a plurality of interconnections, wherein the lower level interconnections included in first to third interconnection layers form the lowest level interconnection layer have pitches less than 2 micrometers and the high level interconnections included in the remaining interconnection layers have pitches in the range from 2 to 3 micrometers.

8 Claims, 7 Drawing Sheets

SEMICONDUCTOR INTEGRATED CIRCUITS WITH SPECIFIC PITCH MULTILEVEL INTERCONNECTIONS

BACKGROUND OF THE INVENTION

1. Field of the Invention

The invention relates to semiconductor integrated circuits with multilevel interconnections, and more particularly to semiconductor multilevel interconnections with improved multilevel interconnections of five or more wiring layers.

2. Description of the Related Art

A scaling down of the semiconductor integrated circuits may allow a reduction of resistance in the ON-state of MOS field effect transistors of semiconductor integrated circuits, to thereby achieve a high speed performance of the gate circuits of the semiconductor integrated circuits. On the other hand, the scaling down of the semiconductor integrated circuits also requires a reduction of a width of each of the interconnections connecting the gate circuits of the semiconductor integrated circuits. The reduction of the width of the interconnections results in an increase in the resistance of the interconnection. The scaling down of the semiconductor integrated circuits requires an increase in the number of the gate circuits of the semiconductor integrated circuits. The increase in the number of gate circuits results in a complicated layout of the interconnections connecting the gate circuits, thereby making it difficult to shorten the length of each of the interconnections. As a result, the RC time constant is increased, thereby a delay time of each of the interconnections of the semiconductor integrated circuits is significantly increased.

As disclosed in U.S. Pat. No. 5,060,045, semiconductor integrated circuits having multilevel interconnections consisting of a plurality of interconnection layers face the problems described below. A reduction of the pitch between the interconnections due to the scaling down of the semiconductor integrated circuits may result in an increase in the interconnection delay time. Particularly, the interconnection time delay is greatest, when the interconnection has a large length, as illustrated in FIG. 1. In large length and small pitch interconnections, the time delay of the interconnection is greater than a time delay of the gate circuits. When seeking to suppress the time delay of the interconnection, reducing the interconnection pitch to 1 micrometer or less results in a lowering of the speed performance inversely proportional to the scaling down and a lowering of the density of the integration of the semiconductor integrated circuits.

To solve the above problems, it was proposed to vary the pitch of the interconnections for each of the interconnection layers disclosed in Japanese Laid-open Patent Appln. No. 60-34039. The semiconductor integrated circuits disclosed therein include a plurality of interconnection layers, for example, first to fourth interconnection layers. The first interconnection layer is the first layer from the bottom layer. The second interconnection layer is the second layer from the bottom, and overlies the first interconnection layer. The third interconnection layer overlies the second interconnection layer. The fourth interconnection layer overlies the third interconnection layer. As illustrated in FIG. 2, the first interconnection layer includes a plurality of first interconnections 301 aligned in parallel in a first direction, so as to have a first pitch "a" relative to adjacent interconnections. The second interconnection layer includes a plurality of second interconnections 302 aligned in parallel in a second direction vertical to the first direction, so as to have a second pitch "b" relative to adjacent interconnections. The third interconnection layer includes a plurality of third interconnections 303 aligned in parallel to the first direction, so as to have a pitch equal to two times the first pitch, relative to adjacent interconnections. The fourth interconnection layer includes a plurality of fourth interconnections 304 aligned in parallel to the second direction, so as to have a pitch equal to two times the pitch of the second pitch, relative to adjacent interconnections. The above interconnection structure permits the top interconnections having the large pitches to have larger lengths and large widths, thereby allowing the resistance of the top interconnection to be small. The top interconnections 303 and 304 have priorities in use over the bottom interconnections 301 and 302 so as to reduce the time delay of the top interconnections, wherein the top interconnections have larger lengths than the lengths of the bottom interconnections.

The above interconnection structure, however, has a problem related to the difficulty in improving the density of the circuit integration due to the limitation of increasing the number of the top interconnections having the large pitches.

Another way to solve the above problem is disclosed in Japanese Laid-open Patent Appln. No. 63-132448, in which an automatic layout design method was proposed. A width of the interconnection is varied in the automatic layout process to comply with the requirement of allowed delay times of the interconnections. Still another way to solve the above problem is disclosed in Japanese Patent Appln. No. 1-43800, wherein the interconnection pitch of the macro-cells is 2.5 micrometers or more. As illustrated in FIG. 3, an interconnection connecting two cells having a small distance is designed to have a small width, while an interconnection connecting two cells having a large distance is designed to have a large width.

The above and still other interconnection structures requires varying the interconnection pitch according to the required various properties of the interconnections, thereby resulting in keeping the alignment rules of the interconnections normally required by the gate arrays and the standard cells. If these interconnection structures are used, the required algorithm for the computer-aided design layout between the gate circuits and the cells is considerably complicated, thereby resulting both in difficulty in ensuring high density of integration of the interconnections and resulting in a large amount of time necessary for the calculations of the computer-aided design layout.

It is therefore necessary to develop multilevel interconnection structures that are able to prevent an increase in the time delay of the interconnections and to allow an improvement in the integration density of the interconnections as well as to allow for an automatic layout design.

OBJECTS OF THE INVENTION

Accordingly, it is a primary object of the present invention to provide a novel multilevel interconnection structure for semiconductor integrated circuits which is free from any of the problems described above.

It is a further object of the present invention to provide a novel multilevel interconnection structure for semiconductor integrated circuits which prevents an increase in time delay of the interconnections.

It is a further object of the present invention to provide a novel multilevel interconnection structure for semiconductor integrated circuits to improve the degree of integration of the semiconductor integrated circuits.

It is a still further object of the present invention to provide a novel multilevel interconnection structure for semiconductor integrated circuits to allow for an automatic layout design to provide the interconnections.

The above and other objects, features and advantages of the present invention will be apparent from the following descriptions.

SUMMARY OF THE INVENTION

The invention provides a multilevel interconnection structure comprising five or more multiple interconnection layers, each of which includes a plurality of connections, for semiconductor integrated circuits wherein lower level interconnections included in first to third interconnection layers forming the lowest level interconnection layer have pitches less than 2 micrometers and the high level interconnections of the remaining interconnection layers have pitches ranging from 2 to 3 micrometers. The interconnections included in the first to third interconnection layers may have a uniform pitch of less than 2 micrometers. The low level interconnections included in the first to third interconnection layers may have a uniform pitch less than 2 micrometers, and the high level interconnections included in the remaining high interconnection layers may have a uniform pitch ranging from 2 to 3 micrometers. The uniform pitch of the low level interconnections included in the first to third low level interconnection layers is in the range from 4.5 to 5.5 times the minimum gate length of MOS field effect transistors of the semiconductor integrated circuits.

The low level interconnections included in the first to third interconnection layers have short average lengths wherein the pitch of the low level interconnections is less than 2 micrometers to allow a reduction of widths of the low level interconnections, thereby resulting in an improvement in the degree of the integration of the low level interconnections included in the first to third interconnection layers. By contrast, the high level interconnections included in the high level interconnection layers have large lengths wherein the pitch of the high level interconnections ranges from 2 to 3 micrometers to allow an enlargement of widths of the high level interconnections, to thereby prevent the time delay of the interconnections from increasing, thus resulting in an improvement in the speed performance of the semiconductor integrated circuits.

BRIEF DESCRIPTION OF THE DRAWINGS

Preferred embodiments of the present invention will hereinafter fully be described in detail with reference to the accompanying drawings.

DESCRIPTION OF THE PREFERRED EMBODIMENTS

Figure 1:
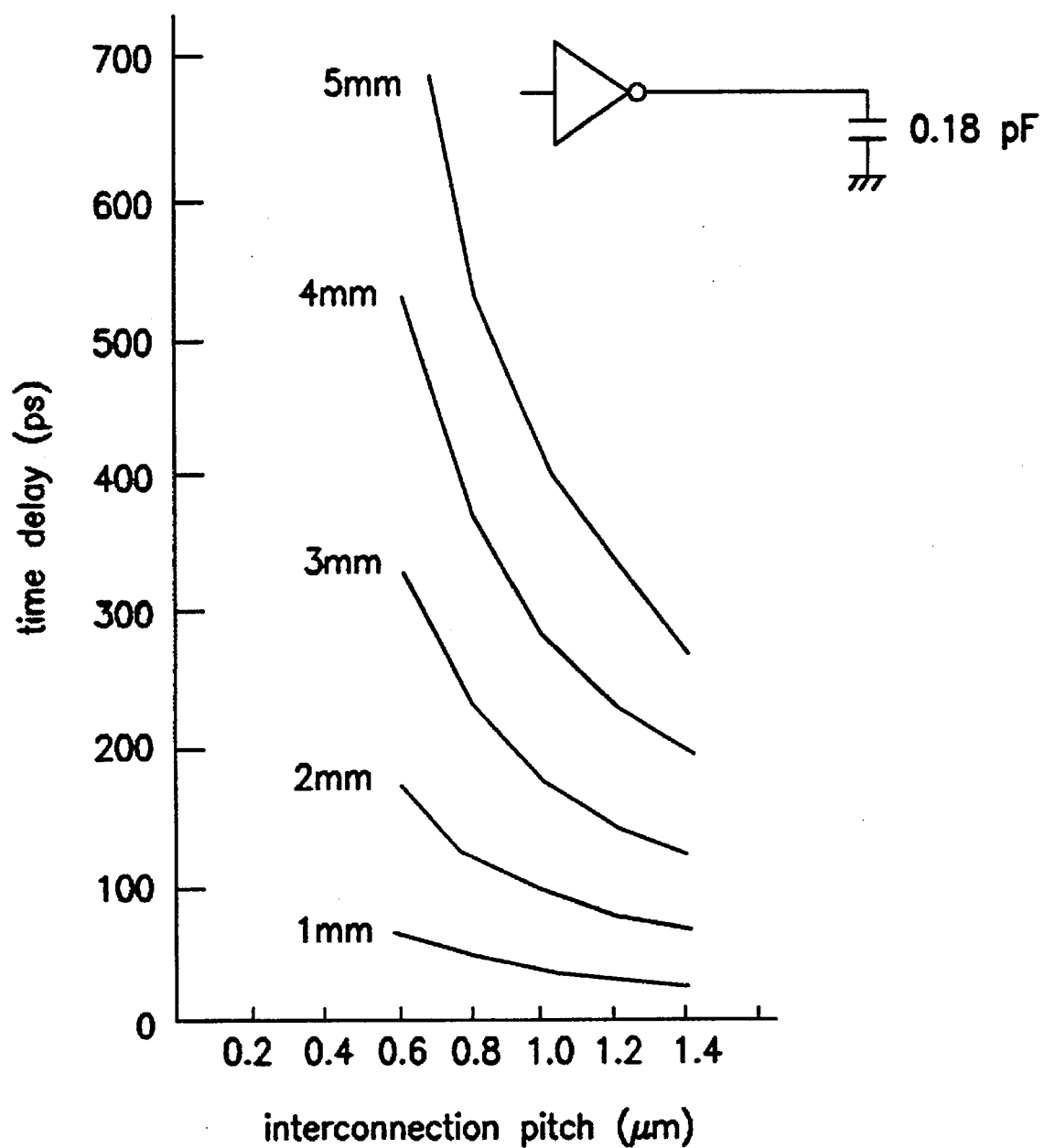
FIG. 1 is a diagram illustrative of a relationship of the time delay of the interconnections versus a pitch between the interconnections and a length of the interconnections.
Figure 2A:
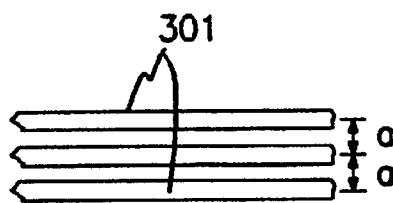
FIG. 2 is a diagram illustrative of the conventional multilevel interconnection structure of semiconductor integrated circuits.
Figure 2C:
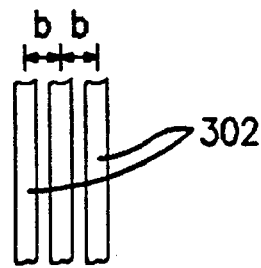
Figure 2B:
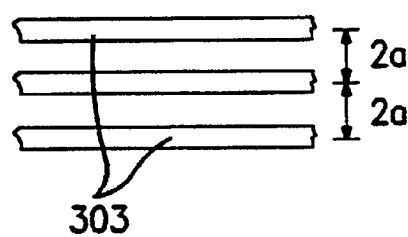
Figure 2D:
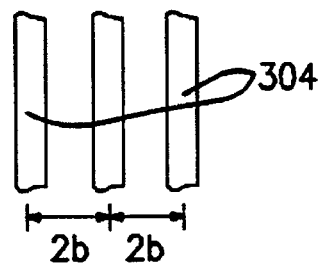
Figure 3:
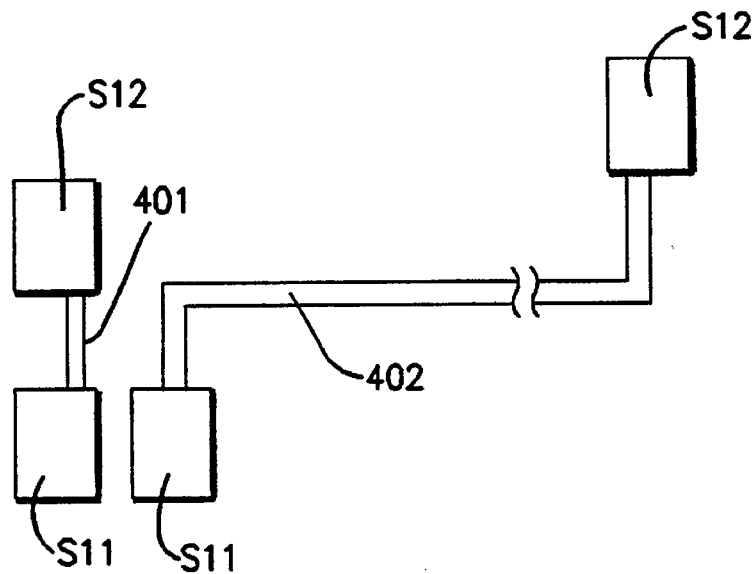
FIG. 3 is a diagram illustrative of another conventional multilevel interconnection structure of semiconductor integrated circuits.
Figure 4:
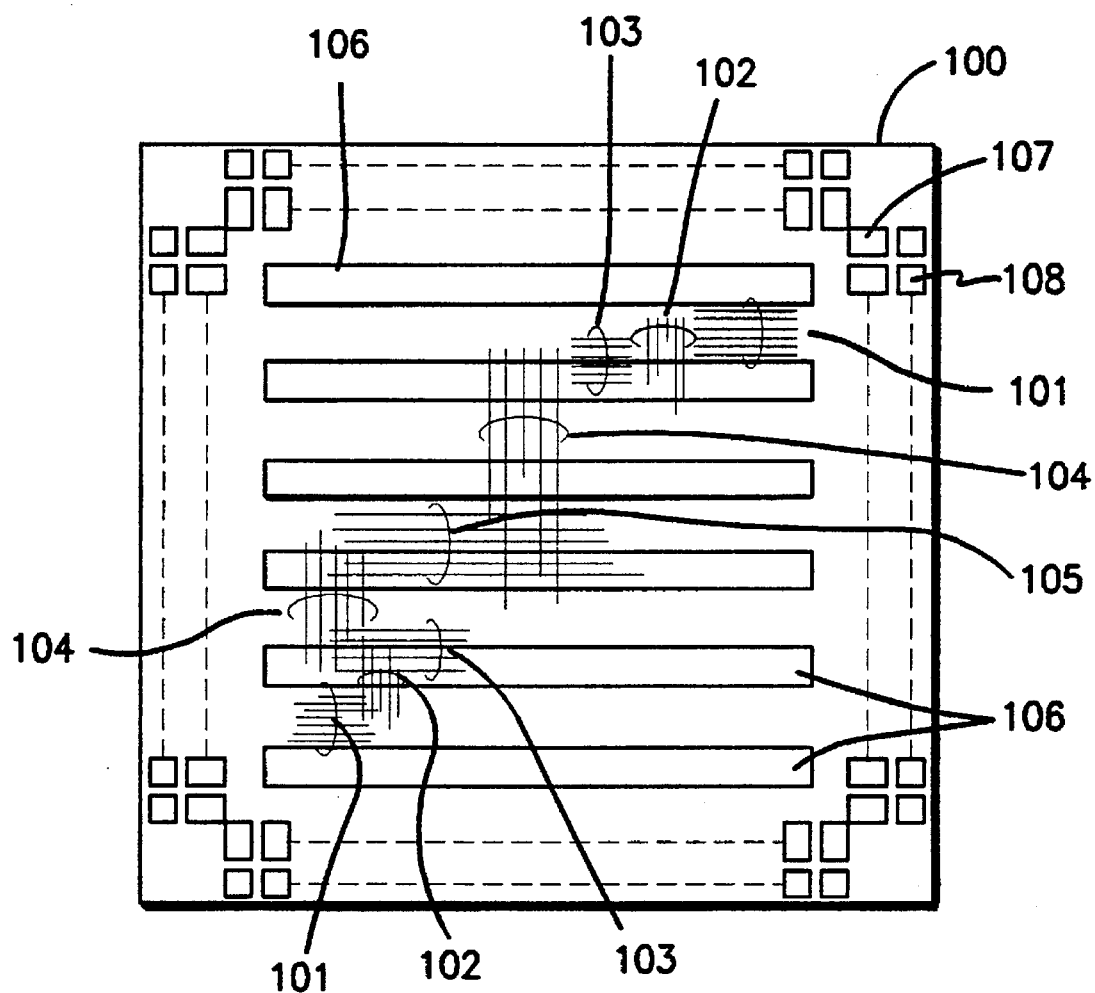
FIG. 4 is a plan view illustrative of a novel multilevel interconnection structure of semiconductor integrated circuits according to the present invention.

A preferred embodiment according to the present invention will be described, in which a novel multilevel interconnection structure of semiconductor integrated circuits is provided. As illustrated in FIG. 4, a semiconductor integrated circuit chip 100 has a plurality of input/output buffers 107 and bonding pads 108 aligned on a peripheral region of the semiconductor integrated circuit chip 100, wherein the bonding pads are provided outside of the input/output buffers 107. The semiconductor integrated circuit chip 100 has a plurality of alignments extending along a first direction of standard cells 106, wherein the standard cell alignments 106 are provided in parallel to each other and spaced from each other to have distances between those in a second direction vertical to the first direction.

A first interconnection layer is provided on a first interlayer insulator wherein the first interconnection layer includes a plurality of first interconnections 101 aligned in parallel to the standard cell alignments 106. The first interconnection layer is the lowest level interconnection layer and the first interconnections 101 are the lowest level interconnections having short average lengths. A second interconnection layer is provided on a second interlayer insulator provided on the first interconnection layer, wherein the second interconnection layer includes a plurality of second interconnections 102 aligned vertical relative to the standard cell alignments 106. The second interconnection layer is the second lowest level interconnection layer and the second interconnections 102 are the second lowest level interconnections having short average lengths.

A third interconnection layer is provided on a third interlayer insulator provided on the second interconnection layer, wherein the third interconnection layer includes a plurality of third interconnections 103 aligned in parallel to the standard cell alignments 106. The third interconnection layer is the third lowest level interconnection layer and the third interconnections 103 are the lowest level interconnections having intermediate average lengths. A fourth interconnection layer is provided on a fourth interlayer insulator provided on the third interconnection layer, wherein the fourth interconnection layer includes a plurality of fourth interconnections 104 aligned vertical relative to the standard cell alignments 106. The fourth interconnection layer is the second highest level interconnection layer and the fourth interconnections 104 are the second highest level interconnections having intermediate average lengths.

A fifth interconnection layer is provided on a fifth interlayer insulator provided on the fourth interconnection layer, wherein the fifth interconnection layer includes a plurality of fifth interconnections 105 aligned in parallel to the standard cell alignments 106. The fifth interconnection layer is the highest level interconnection layer and the fifth interconnections 105 are the highest level interconnections having large average lengths. The first to fifth interconnections 101, 102, 103, 104 and 105 may be made of aluminum or aluminum alloys.

Figure 5A:
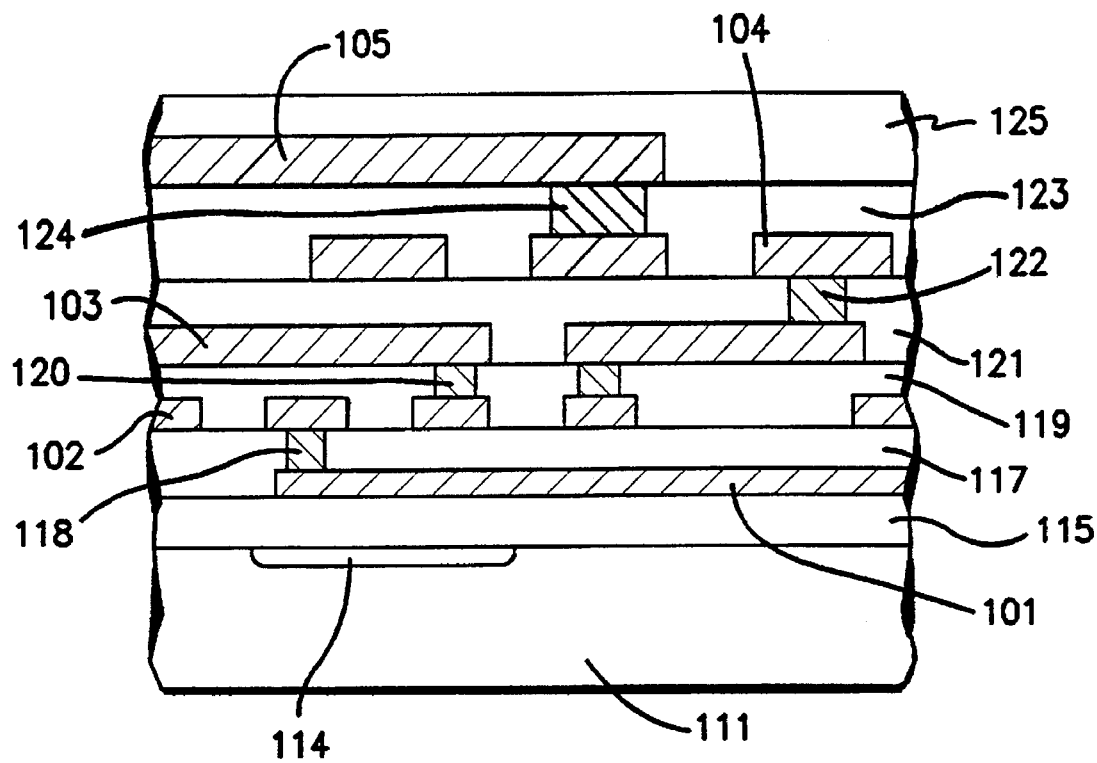
FIG. 5A is a cross-sectional elevation view along a first direction illustrative of a novel multilevel interconnection structure of semiconductor integrated circuits according to the present invention.
Figure 5B:
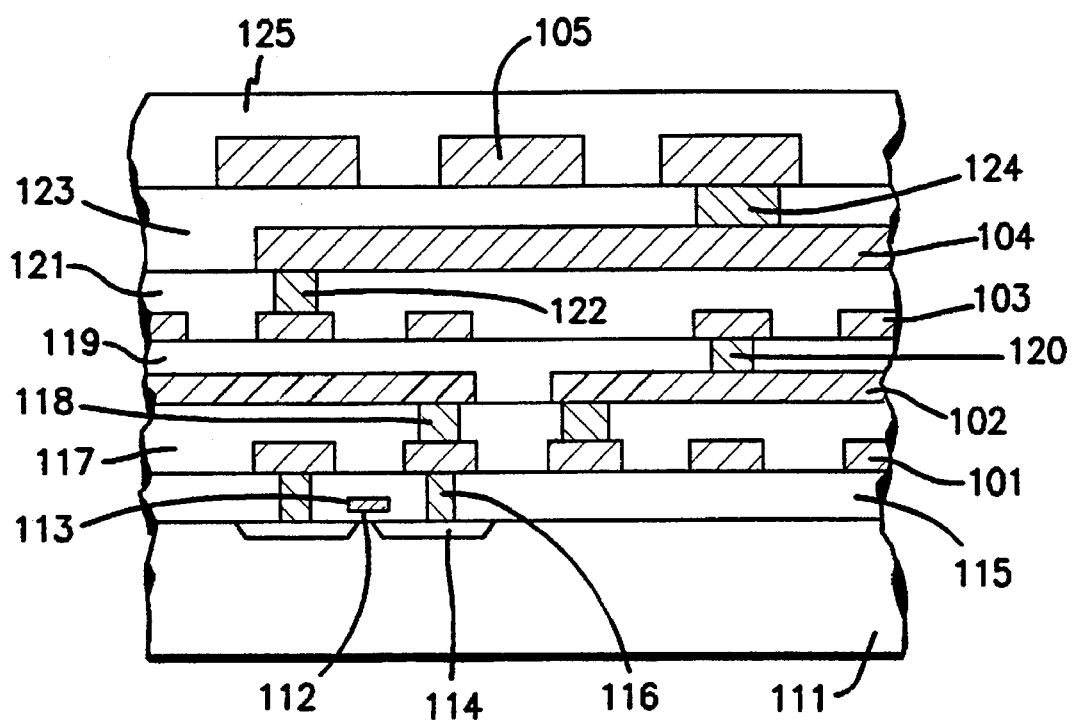
FIG. 5B is a cross-sectional elevation view along a second direction vertical to the first direction illustrative of a novel multilevel interconnection structure of semiconductor integrated circuits according to the present invention.

FIGS. 5A and 5B are respectively cross-sectional elevation views along parallel and vertical directions relative to the standard cell alignments 106 of the semiconductor integrated circuits including the multilevel interconnections in this preferred embodiment.

The multilevel interconnection structure is provided over a silicon substrate 111 of which upper regions are formed with diffusion regions 114 serving as source and drain regions. A channel region is defined between the source and drain diffusion regions 114. A gate electrode is provided over the channel region through a gate insulation film 112 to form a MOS field effect transistor of the standard cell alignment 106. A first interlayer insulator 115 is formed on the silicon substrate 111 to cover the MOS field effect transistor.

The first interconnection layer including the first interconnections 101 as the lowest level interconnections is provided on the first interlayer insulator 115. The first lowest level interconnections 101 are electrically connected to the source and drain diffusion regions 114 through first contact holes 116b formed in the first interlayer insulator 115.

A second interlayer insulator 117 is formed on the first interconnection layer including the lowest level interconnections 101. The second interconnection layer including the second interconnections 102 as the second lowest level interconnections is provided on the second interlayer insulator 116. The second lowest level interconnections 102 are electrically connected to the first lowest level interconnections 101 through second contact holes 118 formed in the second interlayer insulator 116.

A third interlayer insulator 119 is formed on the second interconnection layer including the second lowest level interconnections 102. The third interconnection layer including the third interconnections 103 as the third lowest level interconnections 103 is provided on the third interlayer insulator 119. The third lowest level interconnections 103 are electrically connected to the second lowest level interconnections 102 through third contact holes 120 formed in the third interlayer insulator 119.

A fourth interlayer insulator 121 is formed on the third interconnection layer including the third lowest level interconnections 103. The fourth interconnection layer including the fourth interconnections 104 as the fourth lowest level interconnections 104 is provided on the fourth interlayer insulator 1021. The fourth lowest level interconnections 104 are electrically connected to the third lowest level interconnections 103 through fourth contact holes 122 formed in the fourth interlayer insulator 121.

A fifth interlayer insulator 123 is formed on the fourth interconnection layer including the fourth lowest level interconnections 104. The fifth interconnection layer including the fifth interconnections 105 as the fifth lowest level or the highest level interconnections 105 is provided on the fifth interlayer insulator 123. The fifth lowest level or highest level interconnections 105 are electrically connected to the fourth lower level interconnections 104 through fifth contact holes 124 formed on the fifth interlayer insulator 123. A protection film 125 is formed on the highest level interconnections 105.

The first to third lowest level interconnections 101, 102 and 103 are provided at the same small pitch of less than 2 micrometers. By contrast, the fourth and fifth lowest level interconnections 104 and 105 are provided at the same large pitch, ranging from 2 to 3 micrometers. This multilevel interconnection structure prevents the time delay of the interconnections from increasing and allows a high density integration.

Figure 6:
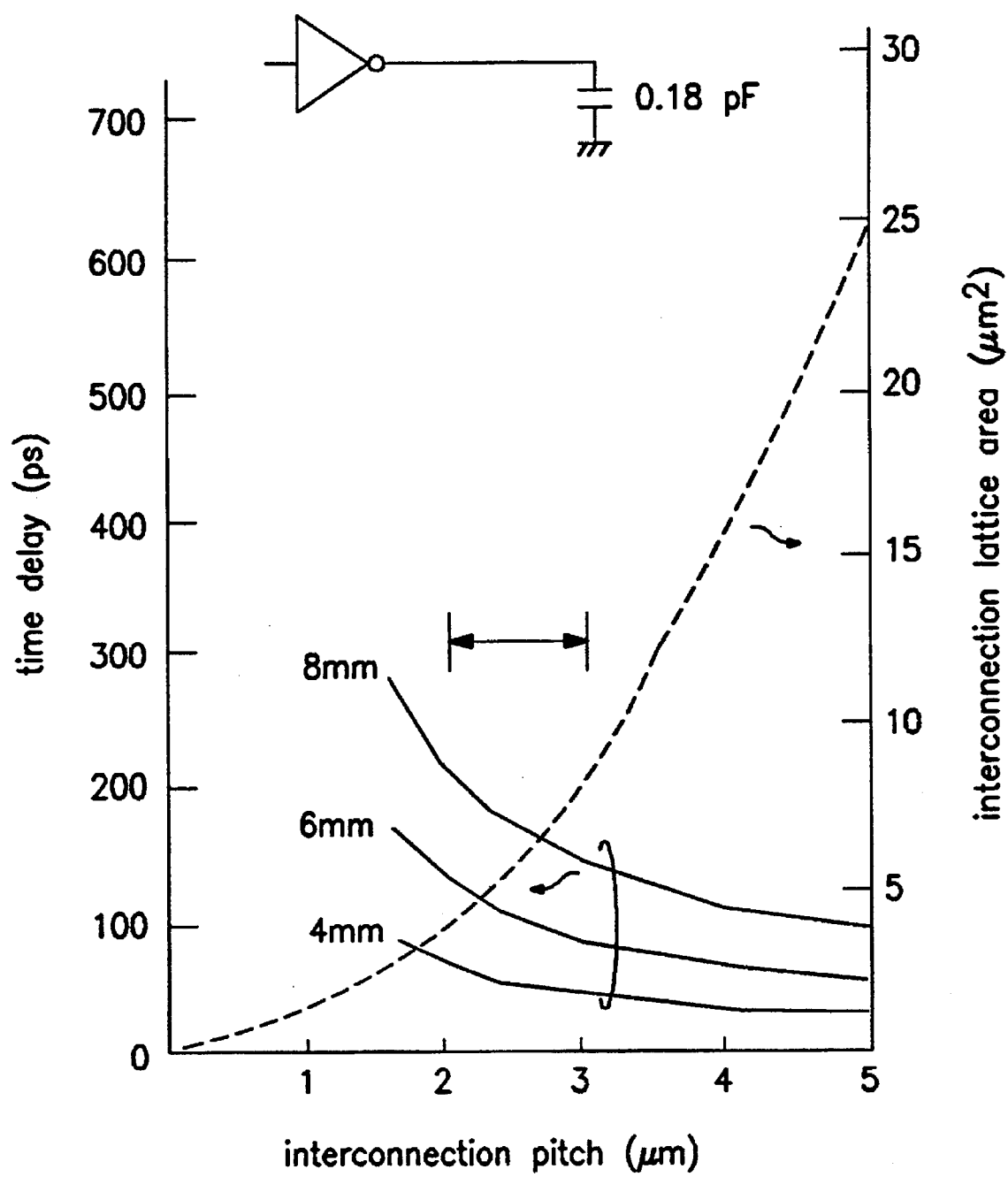
FIG. 6 is a diagram illustrative of relationships of the time delay of interconnections versus interconnection pitches, and of an interconnection lattice areas versus the interconnection pitches, for various lengths of the interconnections.

FIG. 6 is illustrative of relationships of time delay of interconnections versus interconnection pitches and of an interconnection lattice areas versus the interconnection pitches, for various lengths of the interconnections. The time delay of the interconnection increases with the reduction of the pitch between the interconnections, wherein the degree of the increase of the time delay of the interconnections is greatest when the interconnection has a large length. Particularly, a reduction of the interconnection pitch from less than 2 micrometers results in a rapid increase of the time delay of the interconnection. The interconnections having large lengths require a large pitch of 2 micrometers or more, so as to permit the large length interconnections to have a width of approximately 1 micrometer, to reduce the resistance of the interconnections. The large pitch of the large length interconnections results in a large interconnection lattice area, thereby a density of the interconnections is reduced. It is preferred that the pitch of the large length interconnections as the high level interconnections be in the range of from 2 to 3 micrometers, to suppress the generation of the time delay of the interconnections and to suppress the lowering of the density of the integration. For that reason, the fourth and fifth interconnections 104 and 105 as the second highest level and first highest level interconnections having relatively large lengths are provided to have pitches in the range of from 2 to 3 micrometers to prevent the time delay of the interconnections from increasing and to allow a relatively high density integration thereof.

By contrast, the first to third lowest level interconnections 101, 102 and 103 having relatively small lengths being relatively unaffected by the time delay of the interconnection are permitted to have small pitches less than 2 micrometers to allow for a higher density integration of the interconnections.

Figure 7A:
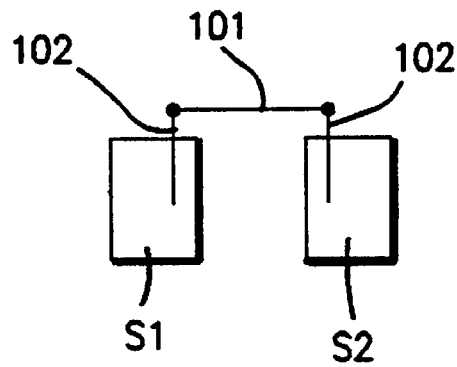
FIGS. 7A, 7B and 7C are diagrams illustrative of novel interconnection structures between gate circuit cells according to the present invention.
Figure 7B:
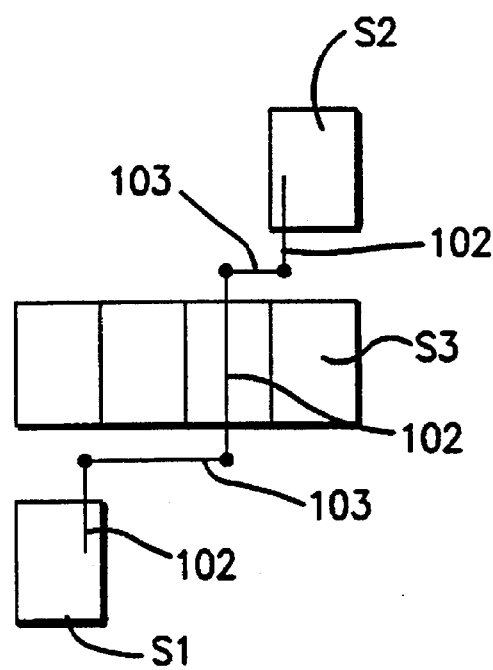

In FIG. 7A, two gate circuit cells S1 and S2 are placed at a small distance, wherein the gate circuit cells are electrically connected through the first lowest level and second lowest level interconnections 101 and 102 having the relatively small lengths. In FIG. 7B, also, two gate circuit cells S1 and S2 are placed at a relatively small distance, wherein the gate circuit cells are electrically connected through the first to third lowest level interconnections 101, 102,. 103 having the relatively small lengths. The interconnections between the relatively two adjacent gate circuit cells may comprise any one or a combination of the first to third lowest level interconnections 101, 102 and 103 to allow for an improvement in the high density integration of the interconnections.

Figure 7C:
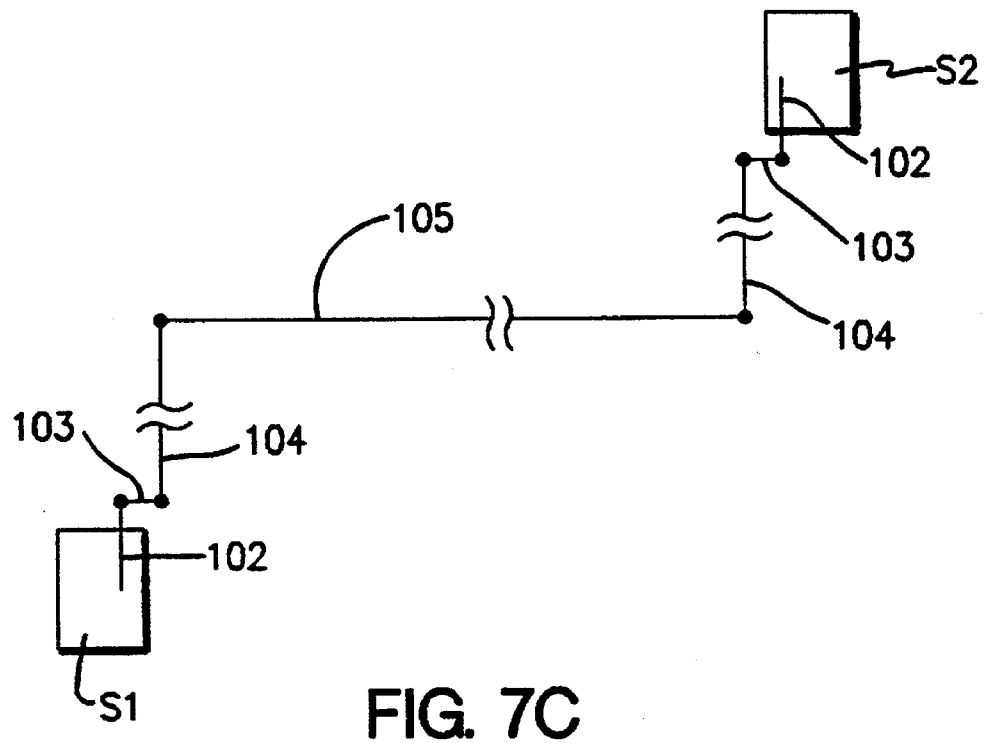

In FIG. 7C, when two gate circuit cells S1 and S2 are placed at a large distance from one another, then the interconnections between the two gate circuit cells S1 and S2 may comprise the lowest to highest level interconnections 101, 102, 103, 104 and 105, wherein the highest level interconnections 105 having the largest pitch and the lowest resistance allows for a long distance interconnection free from the problem with the time delay of the interconnections.

Figure 8A:
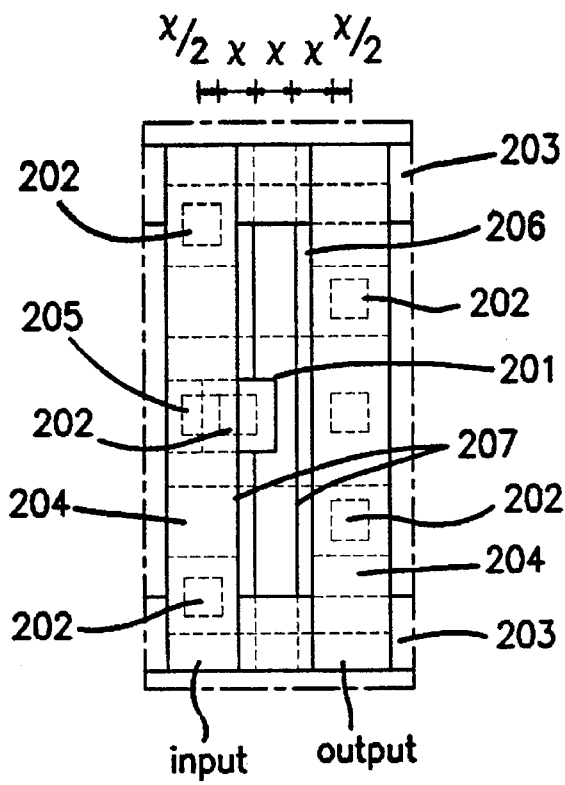
FIG. 8A is a plan view illustrative of the conventional gate circuit cell structure.

By the way, it has been known to so determine the pitch of the second lowest level interconnections that the pitch is four times that the gate length of the MOS field effect transistor. In FIG. 8A, the gate circuit cell is illustrated in the plan view. The gate circuit cell includes a pair of n-channel and p-channel MOS field effect transistors. The gate circuit cell includes a gate electrode 201, contact holes 202, first and second metal layers 203 and 204, a contact hole 205 and p-type and n-type diffusion layers 206 and 207. A distance between center lines of input and output terminals of the second lowest level interconnections is set at four times that of a gate length X of the gate electrode 201. When the MOS field effect transistors has a gate length X less than 0.3 micrometer, then a reduction of an area of the contact hole 202 as compared to areas of the source and drain regions may cause a rapid increase in the contact resistance between the first lowest level interconnections and the source and drain diffusion regions, thereby resulting in a considerable increase of the time delay of the interconnections.

Figure 8B:
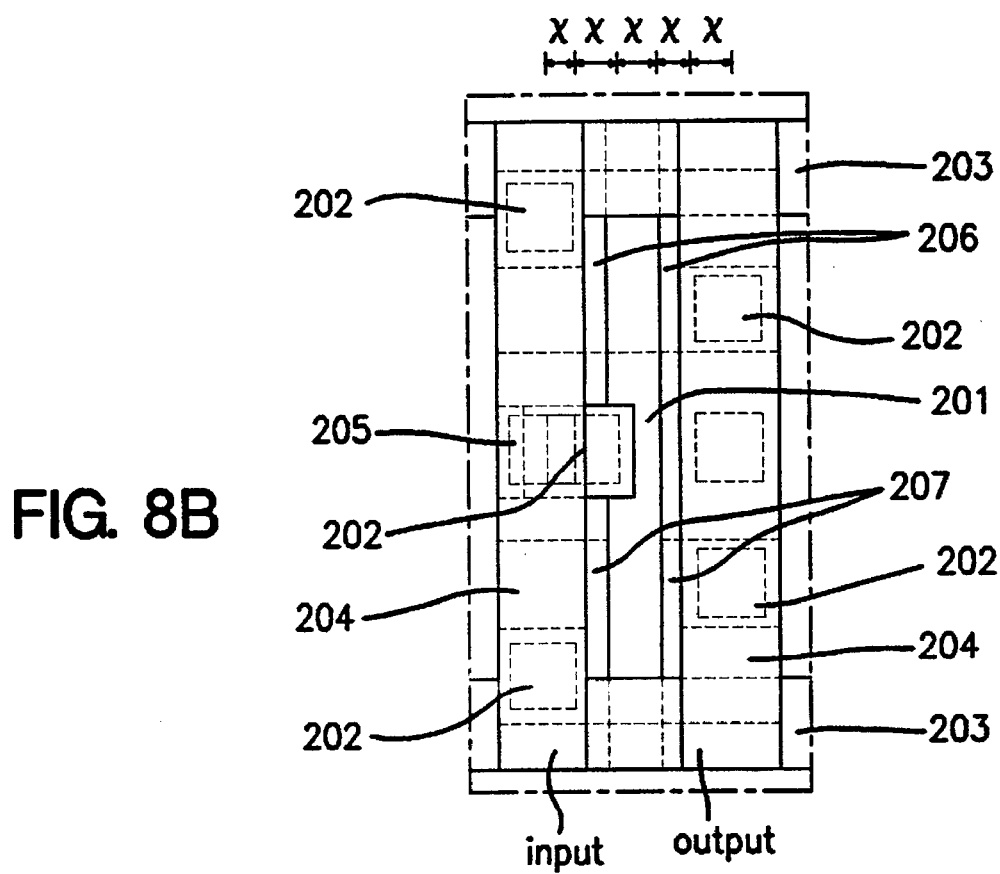
FIG. 8B is a plan view illustrative of a novel gate circuit cell structure according to the present invention.

According to the present invention, to solve the above problem, the area of the contact holes is enlarged up to four times that of the conventional contact holes, as illustrated in FIG. 8B. In this case, almost no increase of the time delay of the interconnections due to the contact resistance appears unless the gate length of the gate electrode is reduced down to 0.1 micrometer or less. Consequently, it is preferred that a distance between the center lines of the input and output terminals of the second lowest level interconnections be set at five times, or in the range from 4.5 to 5.5 times of the gate length X of the gate electrode to prevent the increase of the time delay of the interconnections due to contact resistance. Following to the second lowest level interconnections, the first and third lowest level interconnections are provided to have the same pitch as the second lowest level interconnections, for example, a pitch of approximately five times or in the range from 4.5 to 5.5 times of the gate length X, to thereby suppress the time delay of the interconnection as well as to permit a high density integration thereof.

The multilevel interconnections may be made of a metal including mainly copper in place of the aluminum interconnections. A copper interconnection having a length of 8 millimeters exhibits the same property as the aluminum interconnection having a length of 6 millimeters. It is preferred that the copper interconnection have a length in the range of from 2 to 3 micrometers to suppress the time delay of the interconnection and to keep a high density integration thereof.

Although in the foregoing embodiment the semiconductor integrated circuits have a five level interconnection structure, the present invention is of course applicable to an interconnection structure of six or more levels, wherein the first to third lowest level interconnections have a small pitch less than 2 micrometers and the remaining high level interconnections, namely fourth lowest level and higher level interconnections have a large pitch in the range of from 2 to 3 micrometers.

Consequently, the low level interconnections included in the first to third interconnection layers have short average lengths, wherein the pitch of the low level interconnections is less than 2 micrometers to permit a reduction of widths of the low level interconnections, thereby resulting in an improvement in a degree of the integration of the low level interconnections included in the first to third interconnection layers. By contrast, the high level interconnections included in the high level interconnection layers have large lengths wherein the pitch of the high level interconnections is in the range of from 2 to 3 micrometers to permit an enlargement of widths of the high level interconnections, to thereby prevent the time delay of the interconnections resulting in an improvement in the speed performance of the semiconductor integrated circuits.

Whereas modifications of the present invention will no doubt be apparent to a person having ordinary skill in the art to which the invention pertains, it is to be understood that the embodiments shown and described by way of illustrations are by no means intended to be considered in a limiting sense. Accordingly, it is to be intended to cover by claims all modifications of the present invention which fall within the spirit and scope of the invention.

What is claimed is:

1. A multilevel interconnection structure for semiconductor integrated circuits, said structure comprising at least five interconnection layer levels, each of said layers including interconnections at each level, wherein first, second and third lowest level interconnections have a first uniform pitch and are so provided in first, second and third lowest level interconnection layers as to have pitches less than approximately 2 micrometers and ranging from 4.5 to 5.5 times a minimum gate length of MOS field effect transistors of said semiconductor integrated circuits, and remaining higher level interconnections in remaining higher level interconnection layers have a second uniform pitch ranging from approximately 2 micrometers to approximately 3 micrometers.

2. The structure as claimed in claim 1, wherein said interconnections are made aluminium.

3. The structure as claimed in claim 1, wherein said interconnections are made of copper.

4. The structure as claimed in claim 3, wherein said structure comprises five interconnection layers level comprising:

a first lowest level interconnection layer provided on a first inter-layer insulator on a semiconductor substrate ;

a second lowest interconnection layer provided on a second inter-layer insulator provided on said first lowest level interconnection layer;

a third lowest level interconnection layer provided on a third inter-layer insulator provided on said second lowest level interconnection layer ;

a fourth lowest level interconnection layer provided on a fourth inter-layer insulator provided on said third lowest level interconnection layer ; and a fifth lowest level interconnection layer provided on a fifth inter-layer insulator provided on said fourth interconnection layer.

5. A multilevel interconnection structure for semiconductor integrated circuits, said structure comprising a plurality of interconnection groups having various levels, wherein a higher level interconnection group has a larger pitch and a larger width than an adjacent lower level interconnection group, said structure comprising at least five level interconnection groups, each of said groups including interconnections at each level, a first, second and third lowest level interconnections provided in first, second and third lowest level interconnection groups have a first uniform pitch of less than approximately 2 micrometers and in a range from 4.5 to 5.5 times of a minimum gate length of MOS field effect transistors of said semiconductor integrated circuits and remaining higher level interconnections in remaining higher level interconnection groups have a second uniform pitch in the range from approximately 2 micrometers to approximately 3 micrometers.

6. The structure as claimed in claim 5, wherein said interconnections are made or aluminium.

7. The structure as claimed in claim 5, wherein interconnections are made of cooper.

8. The structure as claimed in claim 7, wherein said structure comprises five level interconnection groups comprising :

a first lowest level interconnection group provided on a first inter-layer insulator a semiconductor substrate;

a second lowest interconnection group provided on a second inter-layer insulator provided on said first lowest level interconnection group ;

a third lowest level interconnection group provided on a third inter-layer insulator provided on said second lowest level interconnection group;

a fourth lowest level interconnection group provided on a fourth inter-layer insulator provided on said third lowest level interconnection group ; and a fifth lowest level interconnection group provided on a fifth inter-layer insulator provided on said fourth interconnection group.

\* \* \* \* \*